(12) United States Patent
Wurmfeld

(10) Patent No.: US 10,595,432 B2
(45) Date of Patent: *Mar. 17, 2020

(54) APPARATUS FOR MOUNTING PROCESSORS FOR CLUSTER COMPUTING

(71) Applicant: Capital One Services, LLC, McLean, VA (US)

(72) Inventor: David Wurmfeld, Fairfax, VA (US)

(73) Assignee: Capital One Services, LLC, McLean, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/259,061

(22) Filed: Jan. 28, 2019

(65) Prior Publication Data

US 2019/0191587 A1     Jun. 20, 2019

Related U.S. Application Data

(63) Continuation of application No. 15/849,846, filed on Dec. 21, 2017, now Pat. No. 10,292,296, which is a continuation of application No. 15/848,369, filed on Dec. 20, 2017, now Pat. No. 10,499,524.

(51) Int. Cl.
| | |
|---|---|
| *H05K 7/14* | (2006.01) |
| *H05K 7/20* | (2006.01) |
| *G06F 1/18* | (2006.01) |
| *G06F 11/20* | (2006.01) |

(52) U.S. Cl.
CPC .......... *H05K 7/1487* (2013.01); *G06F 1/184* (2013.01); *G06F 1/186* (2013.01); *G06F 11/2041* (2013.01); *H05K 7/1409* (2013.01); *H05K 7/1429* (2013.01); *H05K 7/1431* (2013.01); *H05K 7/1444* (2013.01); *H05K 7/1489* (2013.01); *H05K 7/20709* (2013.01); *H05K 7/1405* (2013.01)

(58) Field of Classification Search
CPC . G06F 1/20; G06F 1/183; G06F 1/189; G06F 1/181; G06F 1/184; G06F 1/185; G06F 1/186; G06F 11/2041; G06F 13/409; H05K 7/1487; H05K 7/1489; H05K 7/20709; H05K 7/1442; H05K 7/1434; H05K 7/1431; H05K 7/1429; H05K 7/1444; H05K 7/1405; H05K 1/14; H05K 1/144

See application file for complete search history.

(56) References Cited

U.S. PATENT DOCUMENTS

| | | |
|---|---|---|
| 3,272,933 A | 9/1966 | Henderson |
| 3,833,840 A | 9/1974 | Sinden |
| 4,542,442 A | 9/1985 | Drexler |
| 4,589,712 A | 5/1986 | Hastings |
| 4,679,872 A | 7/1987 | Coe |
| 4,850,892 A | 7/1989 | Clayton |
| 4,862,075 A | 8/1989 | Choi |

(Continued)

*Primary Examiner* — Patrick D Hawn
(74) *Attorney, Agent, or Firm* — Finnegan, Henderson, Farabow, Garrett & Dunner, LLP

(57) ABSTRACT

A bracket for mounting a processor and a support structure for receiving bracket-supported processors for cluster computing are provided. In some embodiments, a bracket may be configured to receive a processor and fasten the processor to the bracket. The bracket may be configured to mount the processor to a support structure. The support structure may be configured to receive an array of brackets. The support structure may be configured to be stacked in combination with additional support structures.

19 Claims, 8 Drawing Sheets

(56) References Cited

U.S. PATENT DOCUMENTS

| | | |
|---|---|---|
| 4,903,603 A | 2/1990 | Longerich |
| 4,922,381 A | 5/1990 | Longerich |
| 5,060,111 A | 10/1991 | Takashima |
| 5,063,475 A | 11/1991 | Balan |
| 5,150,279 A | 9/1992 | Collins |
| 5,289,694 A | 3/1994 | Nordin |
| 5,301,089 A | 6/1994 | Takashima |
| 5,319,526 A | 6/1994 | Takashima |
| 5,621,617 A | 4/1997 | Goss |
| 5,650,917 A | 7/1997 | Hsu |
| 5,726,865 A | 3/1998 | Webb |
| 5,889,651 A | 3/1999 | Sasaki |
| 5,903,432 A | 5/1999 | McMahon |
| 6,078,504 A | 6/2000 | Miles |
| 6,155,433 A | 12/2000 | Anderson et al. |
| 6,269,001 B1 | 7/2001 | Matteson et al. |
| 6,381,148 B1 | 4/2002 | Daskalakis et al. |
| 6,664,673 B2 | 12/2003 | Lopatinsky |
| 6,744,637 B2 | 6/2004 | Blazic |
| 6,865,085 B1 | 3/2005 | Ferris |
| 7,133,289 B2 | 11/2006 | Arippol |
| 7,221,572 B2 | 5/2007 | Arippol |
| 7,258,991 B2 | 8/2007 | Sullivan |
| 7,679,908 B2 | 3/2010 | Yeh |
| 7,819,667 B2 | 10/2010 | Kowalski |
| 8,189,345 B2 | 5/2012 | Rapp |
| 8,842,432 B2 | 9/2014 | Ehlen |
| 9,532,488 B2 | 12/2016 | Crawford |
| 9,665,134 B2 | 5/2017 | Degner |
| 9,961,788 B2 | 5/2018 | Sullivan |
| 9,985,842 B2 | 5/2018 | White |
| 10,039,211 B2 | 7/2018 | Crawford |
| 2003/0169578 A1 | 9/2003 | Blazic |
| 2004/0014336 A1 | 1/2004 | Merz |
| 2004/0213651 A1 | 10/2004 | Malin |
| 2005/0024821 A1 | 2/2005 | Arippol |
| 2005/0068743 A1 | 3/2005 | Ferris |
| 2010/0046175 A1 | 2/2010 | Rapp |
| 2012/0331269 A1 | 12/2012 | Aras |
| 2013/0234889 A1 | 9/2013 | Hwang |
| 2014/0085812 A1 | 3/2014 | Ehlen |

APPARATUS FOR MOUNTING PROCESSORS FOR CLUSTER COMPUTING

CROSS-REFERENCE TO RELATED APPLICATIONS

This application is a continuation of U.S. patent application Ser. No. 15/849,846, filed Dec. 21, 2017 (now allowed), which is a continuation of U.S. patent application Ser. No. 15/848,369, filed Dec. 20, 2017, the contents of both of which are expressly incorporated herein by reference in their entireties.

TECHNICAL FIELD

The present disclosure generally relates to an apparatus for mounting multiple processors for cluster computing.

BACKGROUND

As technology has developed, the need for processing power has also increased. Cluster computing is a technique often employed to address this demand for increased processing power. In a computer cluster, multiple processors may be connected to each other to operate in parallel to perform coordinated operations. The connections may be made through hardware, networks, and/or software to cause the multiple processors in the cluster to function as a single system, working together to accomplish a programmed task. The multiple processors may be located in physical proximity to each other for ease of execution.

In a cluster application, each computing unit is referred to as a "node." A node may be formed of a single processor or a processor set, to perform a particular task designated by a server. Cluster computing involves multiple servers coordinating tasks across multiple nodes. In doing so, cluster applications offer increased performance over the use of a single processor and are often employed in supercomputers for a wide range of computationally intensive tasks in the field of computational science.

Types of computer cluster models include load-balancing clusters, high-availability clusters, and high-performance clusters. A load-balancing cluster model allocates the number of users or transactions of a particular system across a plurality of nodes. This increases the efficiency and processing time of a server. In a high-availability cluster model, multiple servers interact with a plurality of nodes such that certain servers replicate the operations of other servers to allow continued processing in the event of failure of a single node in the computer cluster. A high-performance cluster model provides parallel data processing for data-intensive computing. In all cluster computer models, advantages may include increased cost efficiency achieved from reduced power consumption and speed compared to use of mainframe computers, increased processing speed, improved network infrastructure, and flexibility for upgrades and adding additional components to the system.

One of the obstacles associated with cluster applications is the limited availability of devices for mounting processors employed in cluster computing without impeding the above-mentioned advantages. Brackets are often used for mounting processors. However, difficulties are often encountered when using brackets for mounting processors for cluster applications, including excessive heat generation and limited access to interfaces on the processor.

A large number of component failures in clusters are heat-related. Thus, there is a demand for a bracket and cluster mount configuration that reduces heat-related failures in order to increase the overall reliability of the cluster.

Brackets currently available support individual processors horizontally. In such an arrangement, the major surface of the processor is generally parallel to a mounting surface, and in cluster configurations each processor is generally stacked on top of one another with limited space between each processor.

This arrangement exacerbates the problem of overheating and minimizes the ability to effectively cool the processors without complex cooling arrangements (e.g., using high air-flow fans, heat sinks, and even liquid-cooling). One challenge associated with cooling through the use of a fan is that the nearby space to which the hot air is forced may be occupied by other processors or even other clusters of processors. Conversely, a cluster may receive hot air discharged by the cooling fan of a nearby cluster. This reduces the overall effectiveness of the cooling system which often does not realize a net reduction of heat surrounding the cluster. Therefore a need exists for curing overheating-induced failures.

While brackets exist for supporting processors, such brackets may exhibit difficulty in supporting processors having a plurality of ports for interfacing with related devices. For example, Raspberry Pi is a low-cost, widely-used, single-board computer configured to accept a plurality of inputs including USB, MicroSD cards, Display Serial Interface, micro USB Power input, HDMI, Camera Serial Interface port, composite video and audio output jack, LAN port, GPIOs pins, etc. Existing brackets mount processors in pairs to a single bracket, often shielding an edge of the processor, which makes it difficult to access ports located on the processor and interface other hardware with the processor.

Existing brackets combined with the stacked cluster configuration described above limit user accessibility to an individual processor and also exacerbate the issue of the heat-induced failures. For example, a user may need to troubleshoot or replace a failed individual processor within the cluster. However, this may be difficult or impossible to do without disrupting the whole cluster, because the target processor may be supported in a dense field of other processors or may be secured to a bracket that is securing another processor. If the failed processor is not replaced, other processors in the cluster may experience a greater load and may generate more heat, leading to more system failures.

Therefore, a need exists for a bracket capable of reducing the number of heat-induced failures within a cluster, while facilitating cluster configurations in which the arrangement of individual processors does not impede a user's ability to easily access a targeted processor. The present disclosure is directed to addressing these and other challenges.

SUMMARY

In the following description, certain aspects and embodiments of the present disclosure will become evident. It should be understood that the disclosure, in its broadest sense, could be practiced without having one or more features of these aspects and embodiments. Specifically, it should also be understood that these aspects and embodiments are merely exemplary. Moreover, although disclosed embodiments are discussed in the context of a processor bracket and, it is to be understood that the disclosed embodiments are not limited to any particular industry.

Disclosed embodiments include a bracket for supporting a processor comprising a base portion configured to receive a first edge of the processor. The bracket may also include an upright portion comprising a first arm and a second arm, the first arm being substantially parallel to the second arm. The bracket may still further comprise a locating pin extending from the base portion in a direction distal to the first arm and second arm.

Consistent with another disclosed embodiment, a bracket for supporting a processor comprises a base portion configured to receive a first edge of the processor. The base portion may comprise a first aperture configured to receive a fastener to mount the base portion to a surface. The bracket may also comprise an upright portion configured to support a major surface of the processor. The upright portion may comprise a first arm and a second arm. The first arm may be substantially parallel to the second arm and extend substantially perpendicular from the base portion. The bracket may still further comprise a first gusset configured to support the first arm at an angle relative to the base portion and a second gusset configured to support the second arm at an angle relative to the base portion.

It is to be understood that both the foregoing general description and the following detailed description are exemplary and explanatory only, and are not restrictive of the disclosed embodiments, as claimed.

BRIEF DESCRIPTION OF DRAWINGS

The accompanying drawings, which are incorporated in and constitute a part of this specification, illustrate several embodiments and, together with the description, serve to explain the disclosed principles. In the drawings.

DETAILED DESCRIPTION

Reference will now be made in detail to exemplary embodiments, examples of which are illustrated in the accompanying drawings and disclosed herein. Wherever convenient, the same reference numbers will be used throughout the drawings to refer to the same or like parts.

The disclosed embodiments are directed to a bracket and to a stacked structure for supporting brackets in cluster applications.

In a cluster, multiple processors operate in parallel to achieve increased processing power. A mounting system must be employed such that processors in the cluster are physically secured to ensure mechanical stability of a system but in such a way to allow access to the processors and their interfaces to facilitate maintenance of the system. Moreover, the mounting system must dissipate heat that is generated from the processors during their operation thereof while providing minimal interference to the system as a whole.

The following description provides examples of systems for securing a processor to a bracket and an apparatus for mounting a processor for cluster computing. The arrangement of components shown in the Figures is not intended to limit the disclosed embodiments, as the components used in the disclosed bracket may vary.

Figure 1:
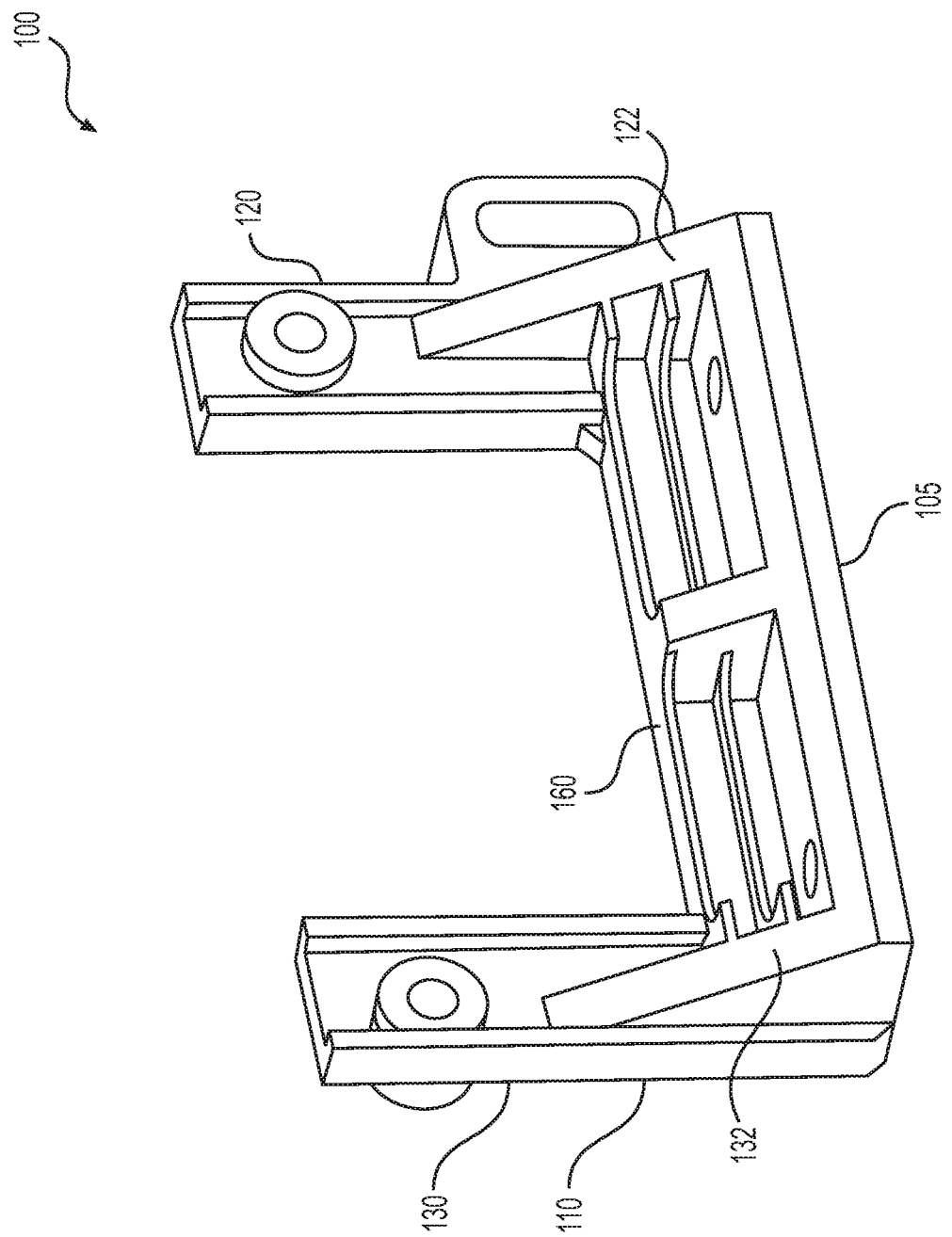
FIG. 1 is an isometric view of an exemplary processor bracket, showing a non-mounting side of the bracket, consistent with disclosed embodiments.

FIG. 1 shows a bracket 100. Bracket 100 may be formed of a layered acrylic material, for example, by a rapid prototyping process. The rapid prototyping method of manufacturing may include one or more of additive manufacturing processes, solid freeform fabrication processes, and computer numerically controlled (CNC) processes. A number of different additive manufacturing processes have been developed that can be used in accordance with various implementations of this disclosure to rapidly produce a prototype or model of the desired bracket from a three-dimensional (3D) data file defining the structure of the bracket.

In accordance with the disclosed embodiment, bracket 100 may include a base portion 105 and an upright portion 110. Upright portion 110 may extend perpendicularly from base portion 105 and may include a first arm 120 and a second arm 130. Upright portion 110 may be supported relative to the base portion 105, in part by a first gusset member 122 and a second gusset member 132. First and second gusset members 122 and 133 may be substantially triangular in shape and may provide reinforced support at the section of bracket 100 where upright portion 110 intersects base portion 105. In particular, first and second gusset members 122 and 132 may extend substantially perpendicularly to the upright portion 110, and may extend along a portion of the length of upright portion 110. First and second gusset members 122 and 132 are configured to improve the stiffness and load-bearing strength of bracket 100 by reinforcing the intersection of upright portion 110 and base portion 105, preventing high stress concentrations caused by bending moments that would otherwise develop at the intersection.

Bracket 100 may also include a rib 160 where upright portion 110 intersects base portion 105. Rib 160 may extend along the length of base portion 105 of bracket 100 and may be configured to extend substantially perpendicularly to upright portion 110. Rib 160 may add strength and stability to minimize deflection of bracket 100. Increasing strength and stability of bracket 100 may further improve the mechanical reliability of a processor mounted to bracket 100.

Figure 2:
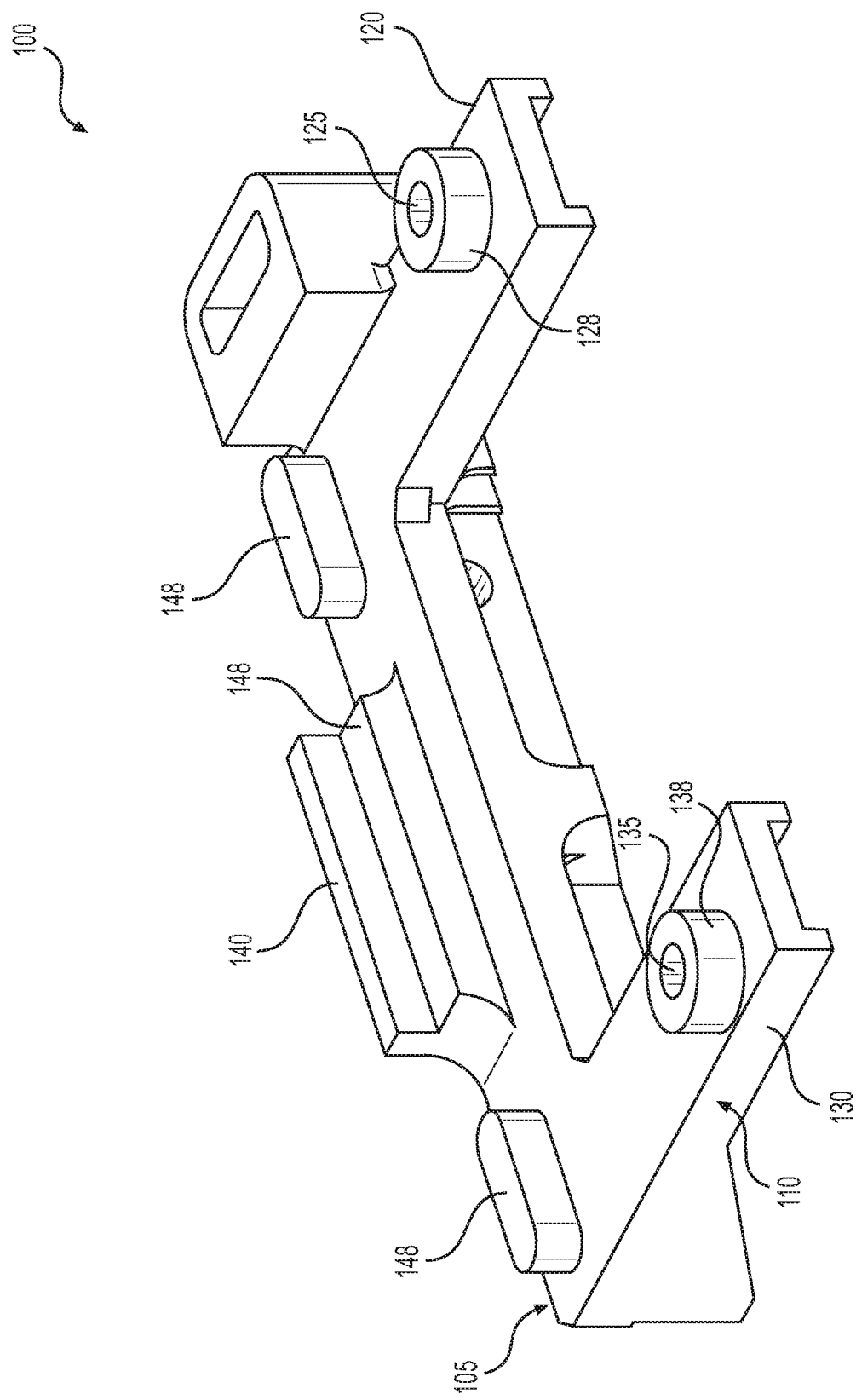
FIG. 2 is an isometric view of an exemplary bracket, showing a top surface of the bracket, consistent with disclosed embodiments.

FIG. 2 shows upright portion 110 and base portion 105 of bracket 100. First and second arms 120 and 130 of upright portion 110 may be configured to extend substantially perpendicularly from the base portion 105, may be substantially parallel to each other and may respectively include first and second fastener apertures 125 and 135. Apertures 125 and 135 may be configured to receive any suitable type of fastener, such as a bolt or screw, to create a non-permanent joint.

Upright portion 110 may include one or more offset members, such as a first offset member 128 which extends substantially perpendicularly from first arm 128 and a second offset member 138 which extends substantially perpendicularly from second arm 138. First and second offset members 128 and 138 may be configured as spacers to surround the first and second receiving apertures 125 and 135, respectively. First and offset members 128 and 138 may be of substantially the same height and may have flat surfaces for mating with a major surface of a processor, to be described below.

Base portion 105 may include a ledge 140 for receiving a first edge of a processor. Ledge 140 may be configured to extend substantially perpendicularly to upright portion 110 and may extend along a partial length of base portion 105. Ledge 140 may have various edge configurations, such as, for example, a tapered edge, square edge, or around edge, and may be centered along the length of base portion 105. In another embodiment, ledge 140 may comprise more than one ledge portion, with multiple ledge portions being positioned symmetrically about the center of bracket 100.

Base portion 105 may include a base offset member 148 which may extend substantially perpendicularly to upright portion 110. Base offset member 148 may be formed of a singular extension along the length of the bracket 100. In another embodiment, base offset member 148 may be divided into portions positioned symmetrically about the center of bracket 100. Base offset member 148 may also be configured to extend adjacent to ledge portion 140. Base offset member 148 may be of a substantially equivalent height as first offset member 128 and second offset member 138. In another embodiment, each of first offset member 128, second offset member 138 and base offset member 148 may be angled at an equivalent degree as each other offset member.

Figure 3:
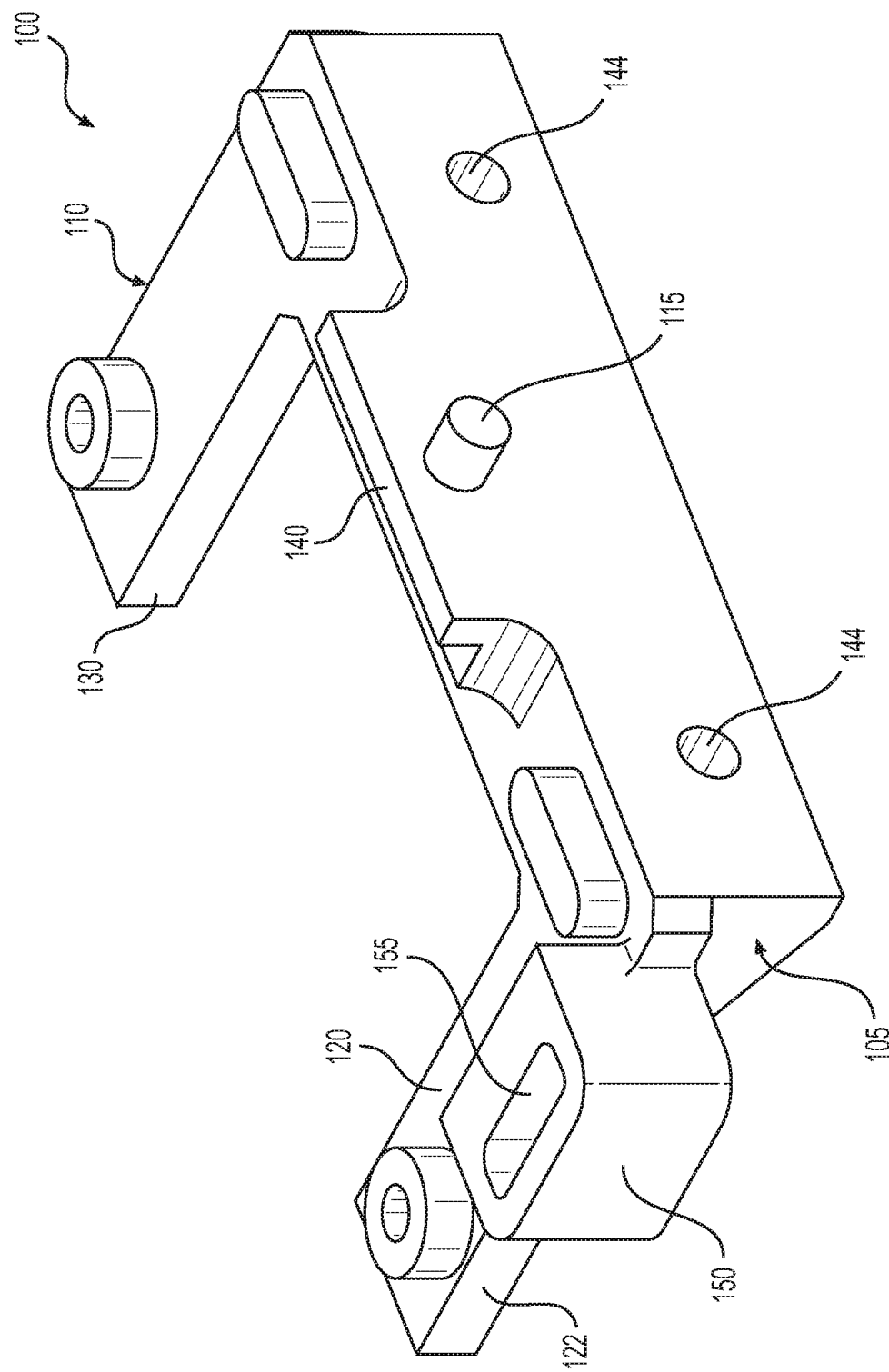
FIG. 3 is an isometric view of an exemplary bracket, showing a bottom surface of the bracket, consistent with disclosed embodiments.

Referring now to FIG. 3, there is shown a securement tab 150. Securement tab 150 may define a securement aperture 155 for securing a cable to the bracket. Securement tab 150 may extend from a peripheral surface of first arm 120. Securement tab 150 may assist with cable management by securing the cable to the securement tab 150. Cables may extend from one or more interface ports on a processor. The cable may be secured using a cable tie or electrical tape. Cable management may prevent cables associated with bracket 100 from becoming tangled with nearby cables.

Base portion 105 may include a mounting aperture 144. Mounting aperture may be configured to receive a fastener to mount bracket 100 and receive various types of fasteners such as a bolt or screw, to create a non-permanent joint. Mounting aperture 144 may extend through base portion 105 substantially parallel to a locating pin 115. Locating pin 115 may extend from base portion 105, distal to ledge 140. Locating pin may also include a lead tapered featured to allow for smooth coupling with a receiving surface.

Figure 4:
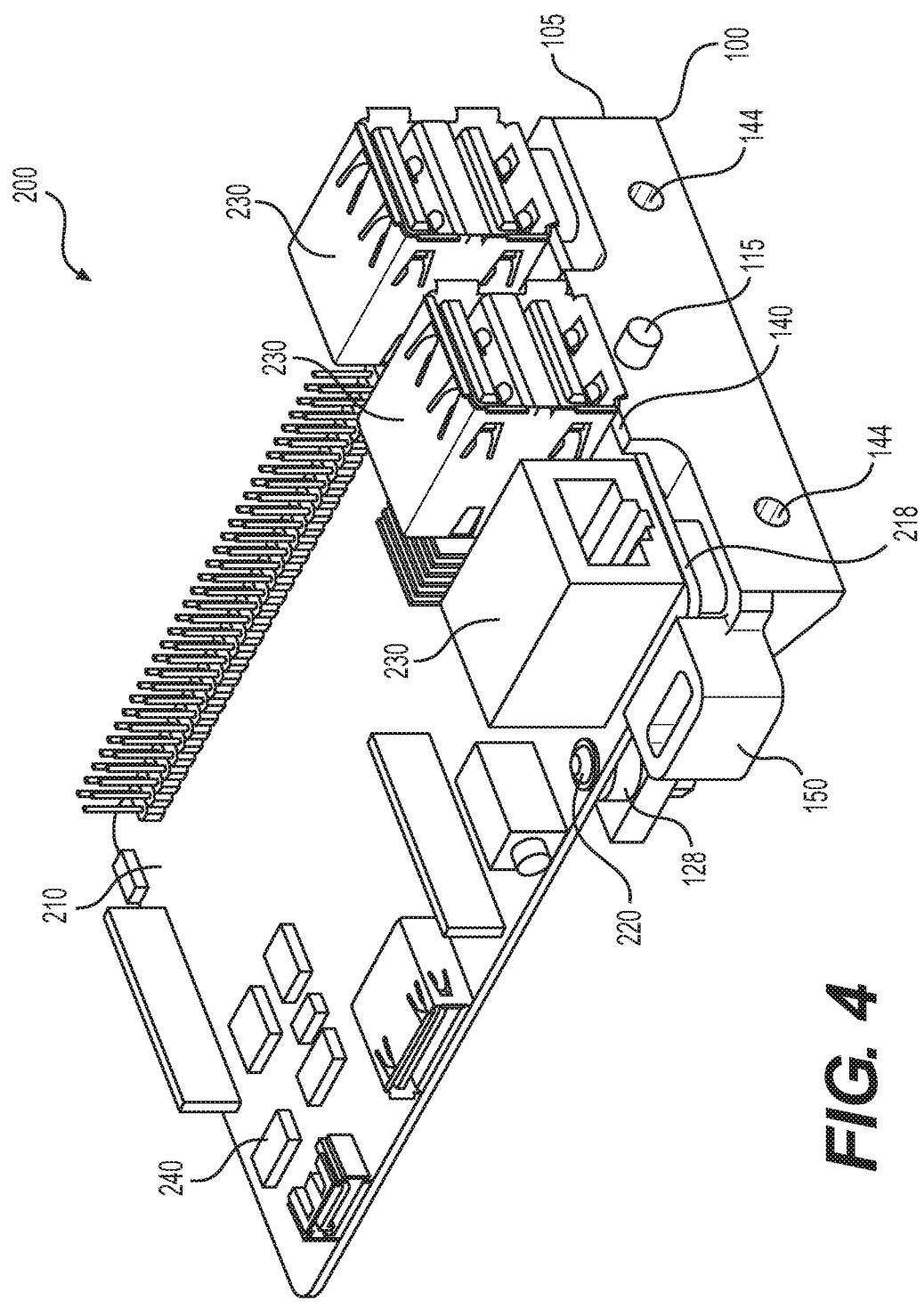
FIG. 4 is an isometric view of an exemplary bracket, showing a processor mounted to the bracket.

Referring now to FIG. 4, there is shown a bracket-processor assembly 200. A processor 210, in the form of a multi-component circuit board, may be mounted to bracket 100 and secured with a fastener 220. A first edge 218 of processor 210 may be in direct contact with ledge 140, such that ledge 140 may exert a normal force on first edge 218 to support processor 210.

Processor 210 may include one or more known processing devices 240 such as, for example, microprocessors from the Pentium™ or Xeon™ family manufactured by Intel™, the Turion™ family manufactured by AMD™, or any of various processors manufactured by Sun Microsystems. Processing devices 240 of processor 210 may comprise a single-core or multiple-core processors that execute parallel processes simultaneously. For example, processor 210 may incorporate a single-core processor device configured with virtual processing technologies. In certain embodiments, processor 210 may use logical processor devices to simultaneously execute and control multiple processes. Processor 210 may implement virtual machine technologies, or other known technologies to provide the ability to execute, control, run, manipulate, store, etc. multiple software processes, applications, programs, etc. In another embodiment. Processor 210 may also include a single-board computer (SBC) comprising a microprocessor and memory built on a single circuit board. The SBC may further comprise ports for interfacing with various pins and connections such as USB 2.0, power input, SD card, or HDMI. Bracket 100 may be configured to secure an SBC including: Raspberry Pi 3, Raspberry Pi Zero, ODROID-XU4, Udoo x86 Ultra, CHIP, Orange Pi, HummingBoard-Gate. Other embodiments may be configured to receive SBCs manufactured by ORDOID, Asus, CanaKit, or Arduino.

Processor 210 may also comprise one or more interface ports 230. Processor 210 may be mounted to bracket 100 such that base portion 105 does not inhibit the accessibility of interface ports 230. Interface ports 230 may be configured to receive any of a variety of inputs including: USB, MicroSD cards, DSI, power input, HDMI, CSI, composite video and audio output jack, LAN port, or GPIOs pins.

Figure 5:
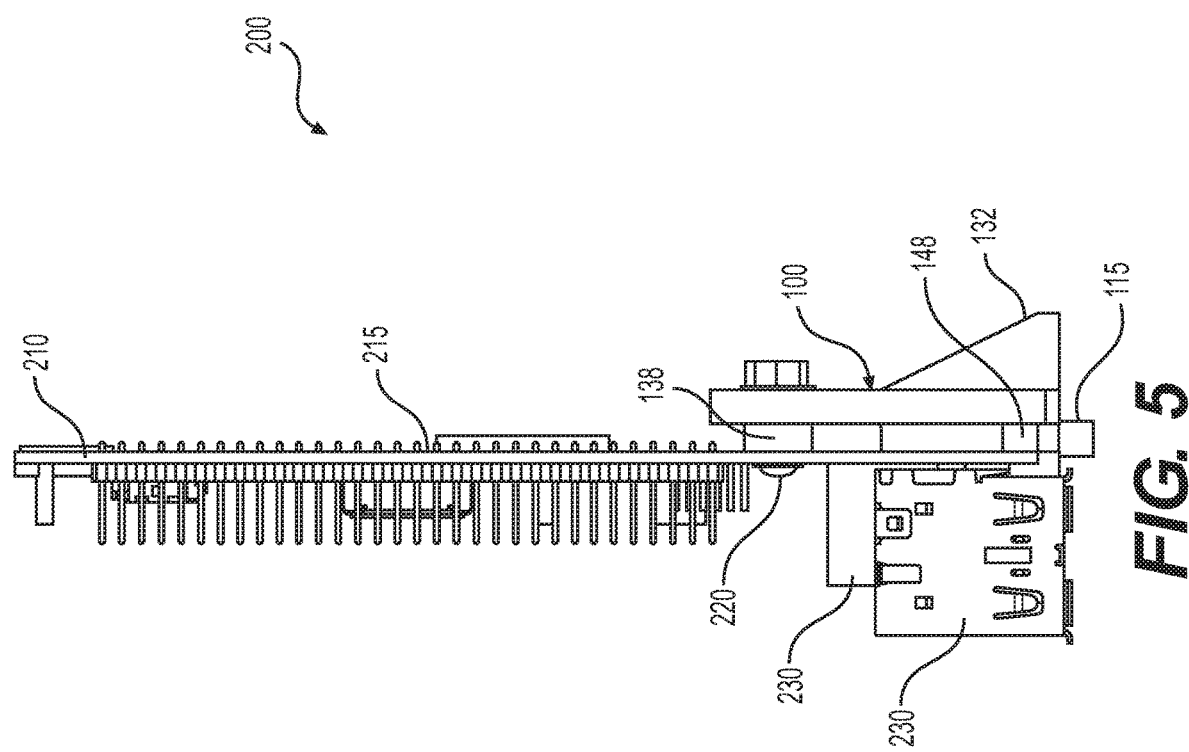
FIG. 5 is a right side view of an exemplary bracket with a processor mounted to the bracket.

Referring now to FIG. 5, there is shown a side view of bracket processor assembly 200. A major surface 215 of processor 210 may be configured to mate with base offset member 148. Major surface 215 of processor 210 may bear against first offset member 128, second offset member 138, and base offset member 148. Fasteners 220 may be configured to be received through each of first and second fastener apertures 124 and 134. Base offset member may be configured to space major surface 215 of the processor 210 from bracket 100.

Figure 6:
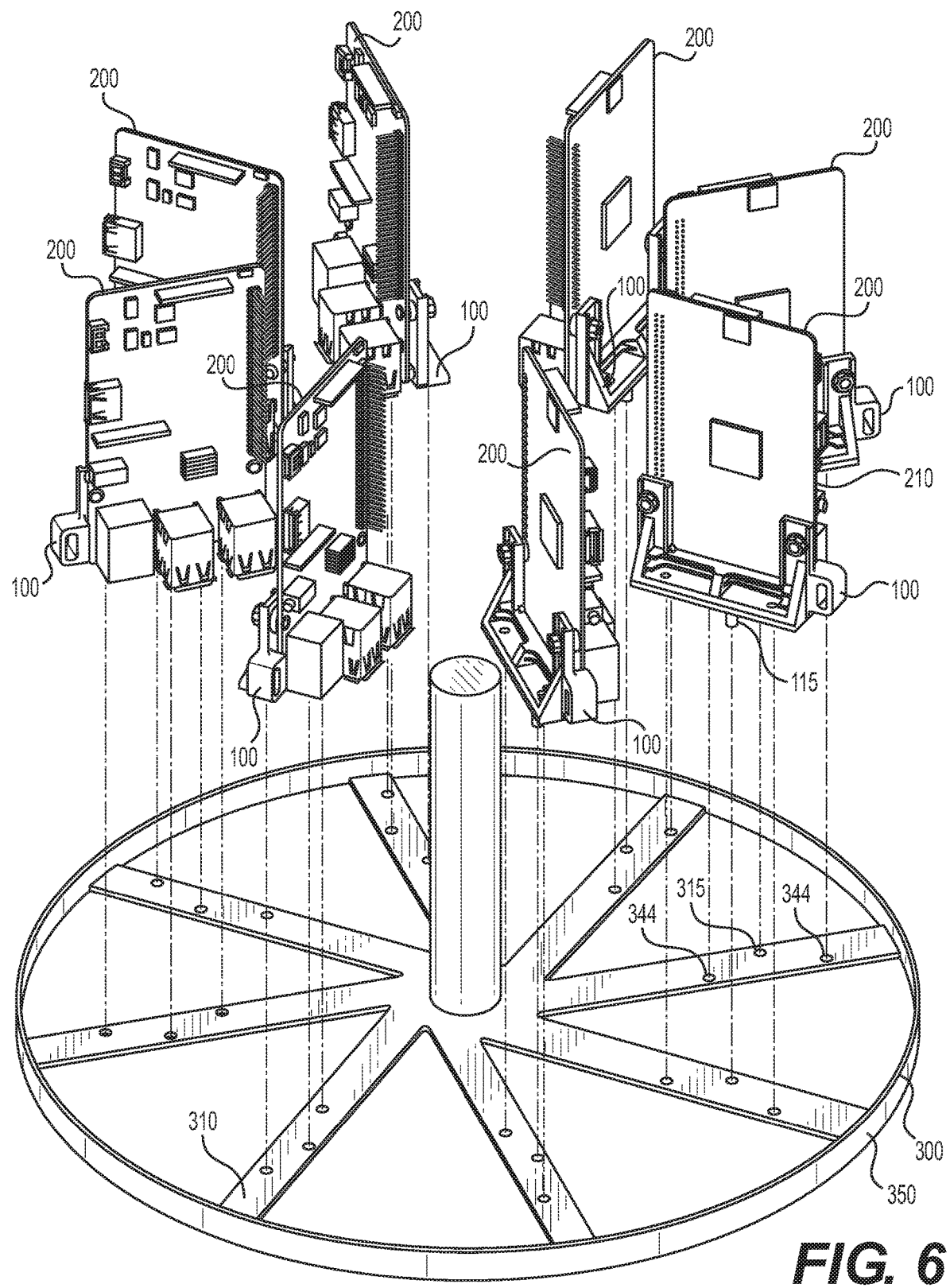
FIG. 6 is an exploded view of an apparatus for supporting a cluster of processor-bracket assemblies aligned for mounting to an exemplary mounting surface, consistent with disclosed embodiments.

Referring now to FIG. 6, there is shown an exploded perspective view of a mounting structure 300 for supporting an array of bracket-processor assemblies 200 in a cluster assembly 400. Mounting structure 300 may include a spoke and hub configuration including a plurality of spokes 340 extending from a spindle 330 to a peripheral ring 350, thus forming a mounting surface 310 configured to bear against a bottom surface of brackets 100. Spindle 330 may extend substantially perpendicularly to mounting surface 310. Each spoke 340 may include mounting surface 310 for receiving a bracket-processor assembly 200. Apertures 360 between spokes 340 may provide for increased air ventilation and cooling through natural convection. Apertures 360 may also allow a user to access interfaces 230 that may be located on processor 210.

Mounting structure 300 may include a peripheral ring 350 defining the outer perimeter of the mounting surface 310. Mounting surface 310 may include a plurality of receiving apertures 315 in spokes 340 each configured to comprise a geometric cross-section complementary to the cross-section of locating pins 115s to engage locating pins 115 of brackets 100. Mounting surface 310 may also include a plurality of mounting apertures 344 configured to align with mounting aperture 144s of brackets 100 when corresponding locating pins 115 are engaged with corresponding receiving apertures 315.

Figure 7:
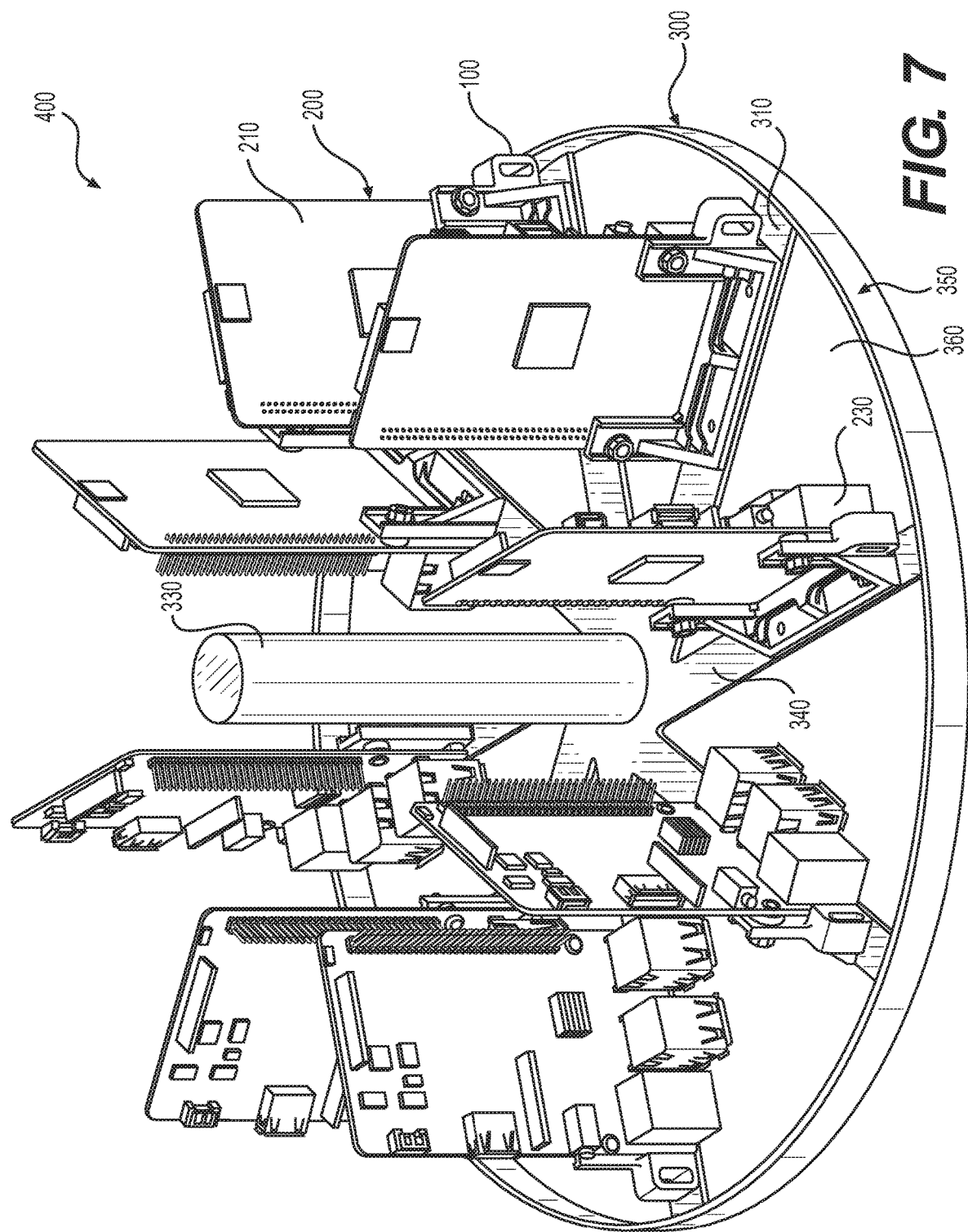
FIG. 7 is an assembled view of the apparatus of FIG. 6.

Referring now to FIG. 7 there is shown is a perspective view of an assembled mounting structure 300. Mounting surface 310 may be configured to receive a plurality of bracket-processor assemblies 200 such that processors 210 are mounted perpendicular to mounting surface 310. Bracket-processor assemblies 200 may be fastened to mounting surface 310 such that interface ports 230 are positioned over aperture 360.

Figure 8:
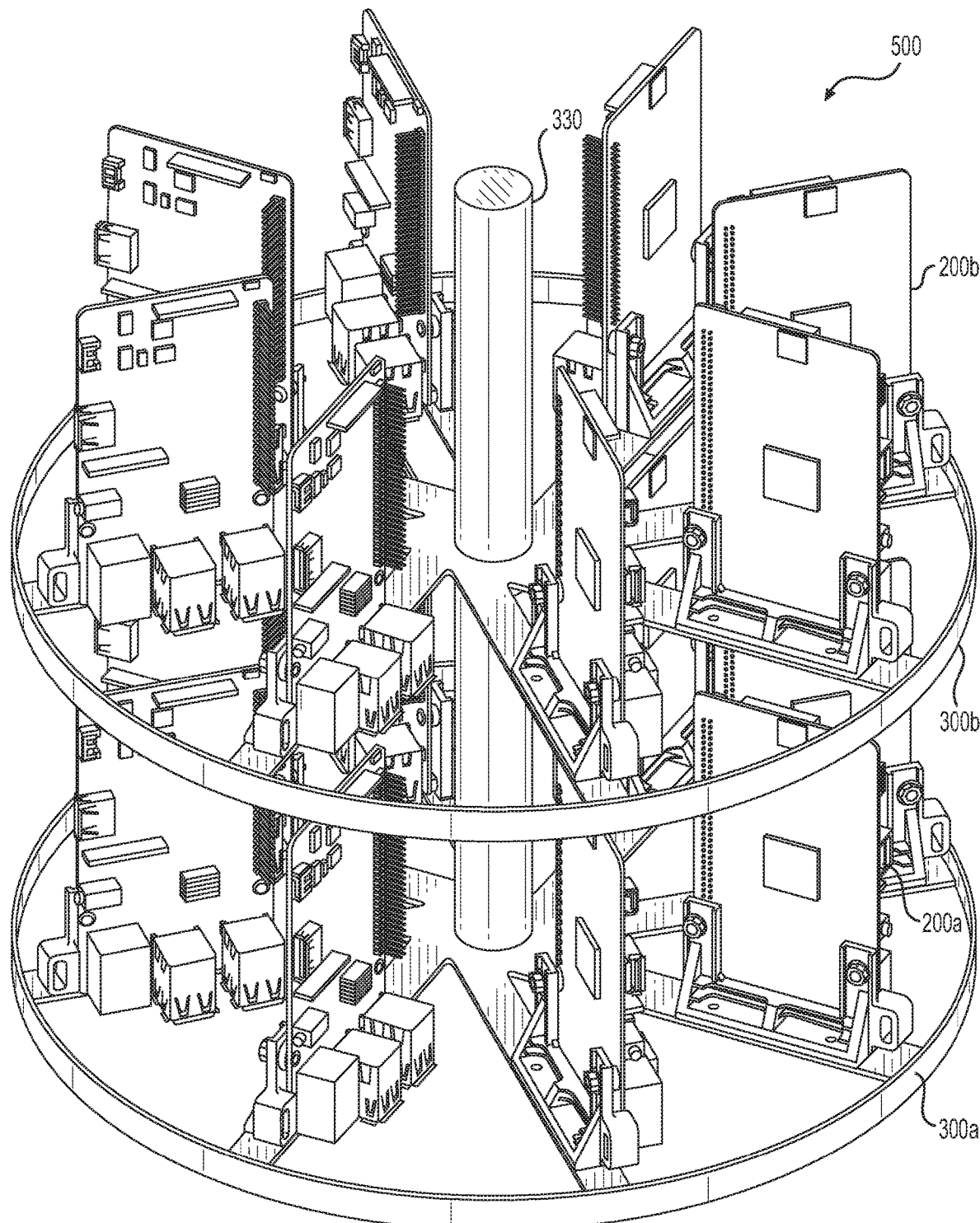
FIG. 8 is an illustration of a stacked apparatus for supporting a cluster of brackets, consistent with disclosed embodiments.

Referring now to FIG. 8, there is shown a stacked support assembly 500 comprising two support structures 300 for supporting a plurality of processors 210. A spindle 330 of a first mounting structure 300a may be configured to mate with a bottom surface of a second mounting structure 300b. In this arrangement, a second circular array of bracket-processor assemblies 200b is stacked above a first circular array of bracket-processor assemblies 200a for a cluster application. Although stacked support assembly 500 is shown in FIG. 8 as including only two support structures 300a and 300b, other embodiments of stacked support assembly 500 may include a plurality of support structures 300a-300n stacked to accommodate bracket-processor assemblies 200 for larger cluster applications.

While illustrative embodiments have been described herein, the scope thereof includes any and all embodiments having equivalent elements, modifications, omissions, combinations (e.g., of aspects across various embodiments), adaptations and/or alterations as would be appreciated by those in the art based on the present disclosure. For example, the number and orientation of components shown in the exemplary systems may be modified. Thus, the foregoing description has been presented for purposes of illustration only. It is not exhaustive and is not limiting to the precise forms or embodiments disclosed. Modifications and adaptations will be apparent to those skilled in the art from consideration of the specification and practice of the disclosed embodiments.

The elements in the claims are to be interpreted broadly based on the language employed in the claims and not limited to examples described in the present specification or during the prosecution of the application, which examples are to be construed as non-exclusive. It is intended, therefore, that the specification and examples be considered as exemplary only, with a true scope and spirit being indicated by the following claims and their full scope of equivalents.

What is claimed is:

1. A support structure for mounting an array of brackets, comprising:
   a first plate configured to receive an array of brackets;
   a spindle extending substantially perpendicular to the first plate, wherein the first plate comprises an inner perimeter configured to engage the spindle and a plurality of radial segments extending from the spindle to a peripheral ring of an outer perimeter of the first plate;
   a first aperture extending from the spindle to the peripheral ring of the outer perimeter, the first aperture separating a first one of the radial segments and a second one of the radial segments, wherein the first one of the radial segments is of substantially a same width as a base portion of one bracket; and
   a second aperture configured to receive a locating pin of the first bracket of the array of brackets.

2. The support structure of claim 1, wherein the first plate is substantially similar.

3. The support structure of claim 1, wherein the first one of the radial segments comprises a mounting surface configured to bear against a bottom surface of the base portion of the one bracket.

4. The support structure of claim 3, wherein the mounting surface is configured to receive the one bracket such that a processor in the one bracket is substantially perpendicular to the mounting surface.

5. The support structure of claim 1, further comprising a third aperture configured to receive a fastener.

6. The support structure of claim 5, wherein the second aperture and the third aperture extend substantially parallel to the spindle and at least partially through the first one of the plurality of radial segments.

7. The support structure of claim 1, wherein the second aperture comprises a cross section sized to engage the locating pin.

8. The support structure of claim 1, further comprising a plurality of first apertures separating respective ones of the plurality of radial segments.

9. The support structure of claim 8, wherein the array of brackets comprises eight brackets.

10. The support structure of claim 1, wherein the first plate or the spindle or both comprises a layered acrylic material formed from a three-dimensional printing process.

11. The support structure of claim 1, further comprising a second plate configured to receive a second array of brackets.

12. The support structure of claim 11, wherein the second plate comprises an inner perimeter configured to engage the spindle.

13. The support structure of claim 12, wherein the second plate is substantially parallel to the first plate.

14. The support structure of claim 11, wherein the second array of brackets comprises eight brackets.

15. The support structure of claim 11, wherein the spindle comprises a proximal portion configured to engage with the first plate and a distal portion configured to engage with the second plate.

16. The support structure of claim 1, wherein the plurality of radial segments are arranged substantially symmetrically about the first plate.

17. The support structure of claim 11, wherein the second plate comprises a layered acrylic material formed from a three-dimensional printing process.

18. The support structure of claim 15, wherein the spindle comprises layered acrylic material formed from a three-dimensional printing process.

19. The support structure of claim 12, wherein the second plate comprises a plurality of radial segments extending from the spindle to an outer perimeter of the second plate.

* * * * *